(12) United States Patent
Nagata et al.

(10) Patent No.: US 7,035,783 B2
(45) Date of Patent: Apr. 25, 2006

(54) PROGRAM AND METHOD CALCULATING RESISTANCE OF A CONDUCTOR IN CONSIDERATION OF A SKIN EFFECT

(75) Inventors: Megumi Nagata, Kawasaki (JP);
Masaki Tosaka, Kawasaki (JP);
Kazuhiko Tokuda, Kawasaki (JP);
Hiroyuki Orihara, Kawasaki (JP);
Hikoyuki Kawata, Kawasaki (JP)

(73) Assignee: Fujitsu LImited, Kawasaki (JP)

( * ) Notice: Subject to any disclaimer, the term of this patent is extended or adjusted under 35 U.S.C. 154(b) by 849 days.

(21) Appl. No.: 10/052,511

(22) Filed: Jan. 23, 2002

(65) Prior Publication Data

US 2003/0083853 A1 May 1, 2003

(30) Foreign Application Priority Data

Oct. 29, 2001 (JP) ............................. 2001-330770

(51) Int. Cl.
*G06F 17/50* (2006.01)
(52) U.S. Cl. ............................................. 703/14; 703/2
(58) Field of Classification Search .................... 703/2, 703/14; 324/525, 691; 257/624
See application file for complete search history.

(56) References Cited

U.S. PATENT DOCUMENTS 5,210,691 A * 5/1993 Freedman et al. .............. 702/7
5,698,982 A * 12/1997 Mitchell ...................... 324/339
5,946,211 A * 8/1999 Glover ......................... 700/97
6,031,986 A * 2/2000 Milsom ........................ 703/14

FOREIGN PATENT DOCUMENTS

JP 2000-101097 4/2000

OTHER PUBLICATIONS

IBM Technical Disclosure (NN9512237) Method for Modeling the Skin Effect in Inductance Calculations Dec. 1, 1995.*
Lavers et al. IEEE Journal (7803-6667-0/01) Constriction Resistance at High Signal Frequencies. 2001.*
W. T. Weeks, et al., Resistive and Inductive Skin Effect in Rectangular Conductors, Nov. 1979, pp. 652-660, vol. 23, No. 6, IBM J. Research & Develop.
"Analysis Tools For High-Speed Digital Signal Circuits," ANSOFT PRODUCTS CATALOG, before Jun. 2000, pp. 27, 28, and 30 (Partial Translation [p. 30, "Skin effect and return current analysis in association with high frequency signals"]).

* cited by examiner

*Primary Examiner*—Albert W. Paladini
(74) *Attorney, Agent, or Firm*—Staas & Halsey LLP (57) ABSTRACT

In a simulation considering a skin effect, a signal conductor is vertically and horizontally divided by faces parallel to the surface of the signal conductor, which are set so that intervals are smaller as the faces are nearer to the surface, and larger as the faces are farther from the surface. Also a ground conductor is vertically divided with a similar method, and an integration calculation is made, so that the resistance of the signal conductor, which corresponds to a given frequency, is obtained.

8 Claims, 12 Drawing Sheets

PROGRAM AND METHOD CALCULATING RESISTANCE OF A CONDUCTOR IN CONSIDERATION OF A SKIN EFFECT

BACKGROUND OF THE INVENTION

1. Field of the Invention

The present invention relates to a transmission waveform simulation when a signal is wired on a printed circuit board of an electronic circuit, and more specifically, to a program and method calculating the resistance of a conductor in consideration of a skin effect.

2. Description of the Related Art

As the frequency of an information appliance becomes higher, so does the operating frequency of a printed circuit board, which is a device peripheral to the information appliance. The higher the frequency of a signal, the more the influence of a skin effect cannot be disregarded. Therefore, an analysis in consideration of the influence becomes necessary. The skin effect means a phenomenon that resistance becomes higher toward the center of a conductor, and an electric current flows only in the proximity of the surface of the conductor.

With a conventional analysis tool, a conductor is divided into a plurality of portions when the resistance of the conductor in consideration of a skin effect is calculated. However, if attempts are made to obtain the resistance with high accuracy, the conductor must be finely divided, and a large amount of time is required to make the calculation. Since also a portion inside the conductor, in which an electric current does not flow, is finely divided with this method, a portion that does not need to be calculated originally is also calculated, which requires a useless calculation time.

SUMMARY OF THE INVENTION

An object of the present invention is to provide a program and method speeding up a calculation of the resistance of a conductor while maintaining the accuracy required for the calculation in a simulation considering a skin effect.

The program according to the present invention is a program for a computer that obtains the resistance of a conductor in consideration of a skin effect according to the frequency of a given signal.

This program causes the computer to execute a process for generating a model where a conductor is divided by a plurality of faces parallel to the surface of the conductor, which are set so that intervals are smaller as the faces are nearer to the surface and larger as the faces are farther from the surface, for calculating the resistance of the conductor, which corresponds to a given frequency, by using the generated model, and for outputting a calculation result.

A portion where an electric current flows and a portion where an electric current does not flow are generated in a conductor due to a skin effect. Generally, an electric current tends to flow along the surface of a conductor. Accordingly, the conductor is divided in parallel to its surface, and a portion nearer to the surface is divided at a smaller interval, and a portion farther from the surface is divided at a larger interval, so that a portion where an electric current flows is calculated in further detail, and a calculation of a portion where an electric current does not flow can be simplified. Accordingly, a calculation of the resistance of a conductor can be made faster while maintaining the accuracy required for the calculation of the resistance corresponding to the frequency.

DESCRIPTION OF THE PREFERRED EMBODIMENTS

Hereinafter, preferred embodiments according to the present invention are described with reference to the drawings.

Figure 1:
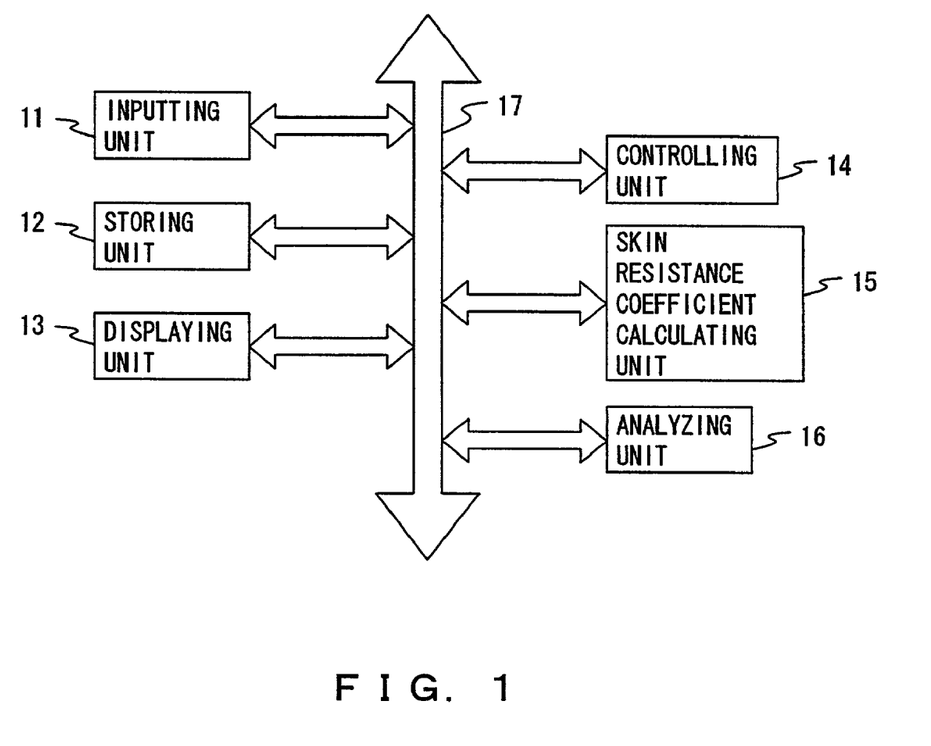
FIG. 1 shows the principle of a simulation device according to the present invention.

FIG. 1 shows the configuration of a simulation device that makes a transmission waveform simulation by using a program according to a preferred embodiment. The simulation device shown in FIG. 1 comprises an inputting unit 11, a storing unit 12, a displaying unit 13, a controlling unit 14, a skin resistance coefficient calculating unit 15, and an analyzing unit 16, among which necessary data is transferred via a bus 17. The controlling unit 14, the skin resistance coefficient calculating unit 15, and the analyzing unit 16 correspond to the program.

Parameters required for the simulation are input from the inputting unit 11, and stored in the storing unit 12. The skin resistance coefficient calculating unit 15 calculates the resistance and the skin resistance coefficient of a conductor according to an analyzed frequency by using the stored parameters. The analyzing unit 16 makes a simulation in consideration of a skin effect by using the calculated values. A result of the calculation made by the skin resistance coefficient calculating unit 15 and a result of the simulation made by the analyzing unit 16 are output from the displaying unit 13. The controlling unit 14 controls the whole of the simulation device.

Normally, the resistance of a conductor varies depending on a frequency. However, if the skin resistance coefficient is learned, the resistance of a conductor can be represented as a function of a frequency. Therefore, a simulation for an arbitrary frequency can be easily performed.

Figure 2:
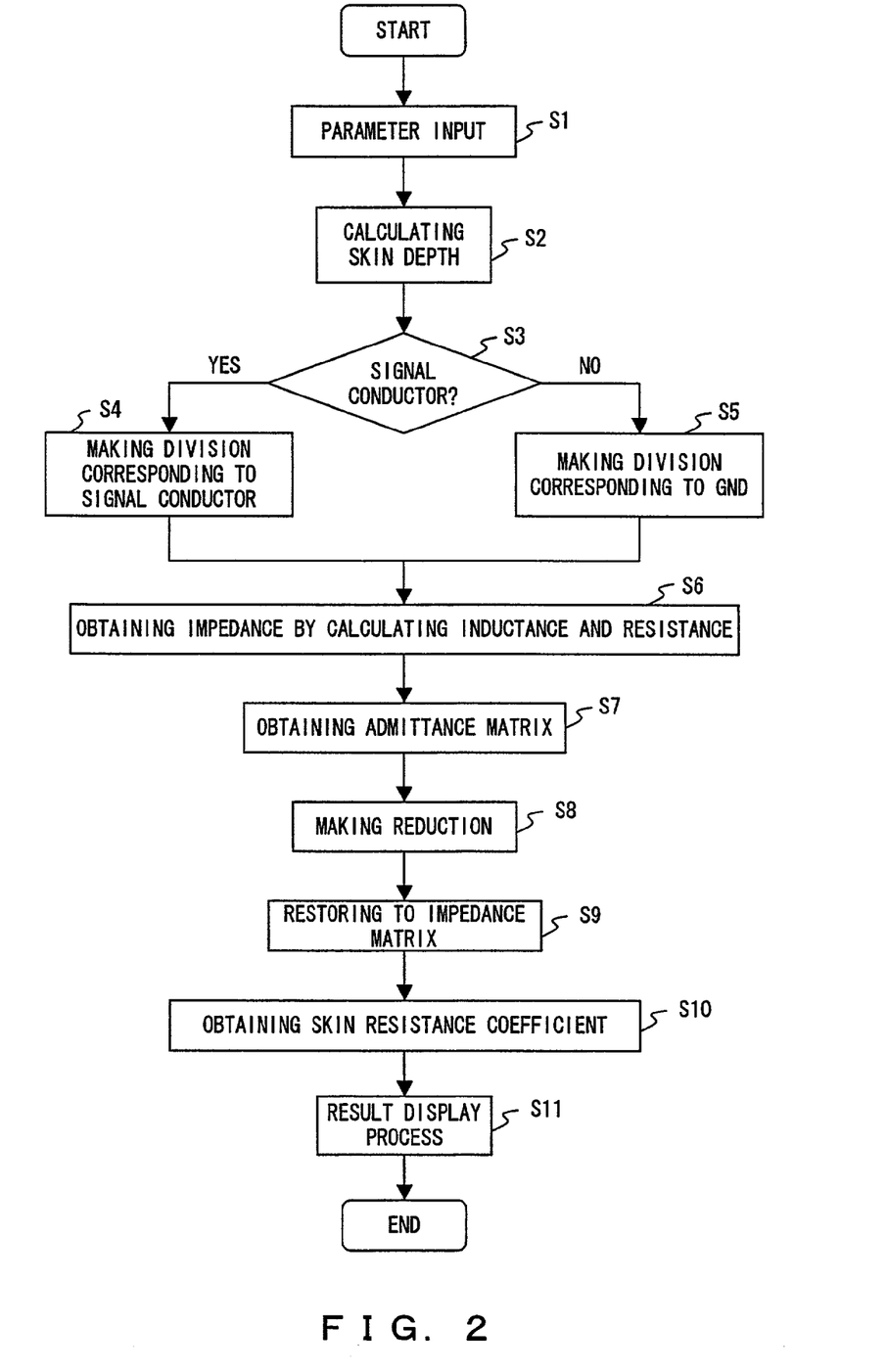
FIG. 2 is a flowchart showing a skin resistance coefficient calculation process.

FIG. 2 is a flowchart showing the calculation process performed by the skin resistance coefficient calculating unit 15. With this process, a conductor to be analyzed is divided into a plurality of segments, each of which is further divided into a plurality of portions, so that the resistance and the skin resistance coefficient of the conductor are calculated with numerical integration. At this time, the calculation based on an algorithm described in the following document is made.

W. T. Weeks et al., "Resistive and Inductive Skin Effect in Rectangular Conductors," IBM J. RES. DEVELOP. Vol. 23 No. 6, pp. 652–660, November 1979.

First of all, a user writes parameters based on a wiring design to an input file, and inputs the parameters to a simulation device (step S1). Here, the user checks the shape of a conductor to be analyzed, the pattern of a transmission line, and the number of conductors, and inputs the parameters relating to the cross-sectional shape of the conductor. Conductors to be analyzed include a signal conductor and a ground (GND) conductor.

Figure 3:
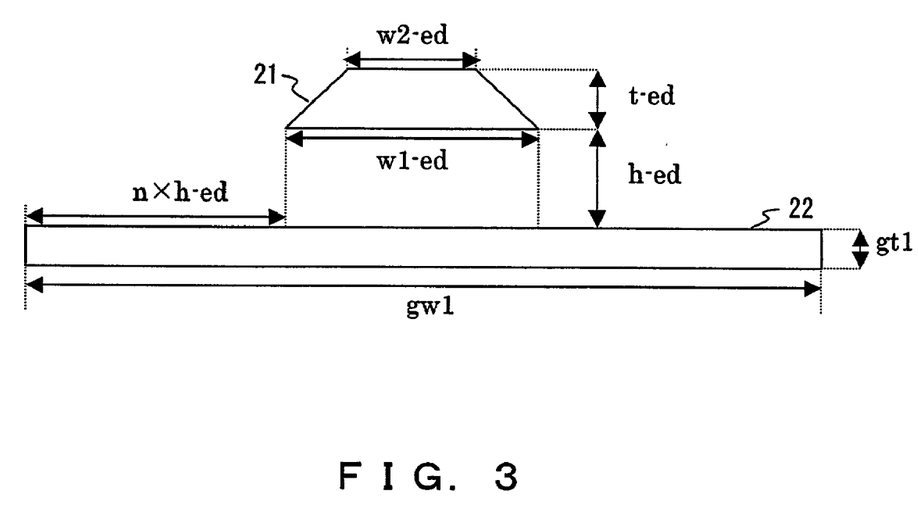
FIG. 3 shows a first conductor model.
Figure 4:
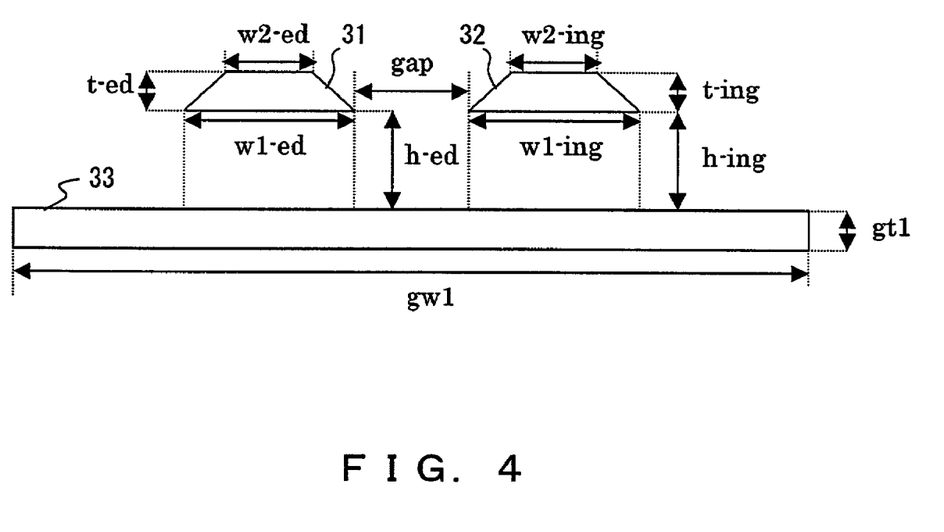
FIG. 4 shows a second conductor model.

FIGS. 3, 4, 5, and 6 show the cross-sectional shapes of conductor models. FIG. 3 shows the cross-sectional shape of a single-conductor microstrip line composed of a signal conductor 21 and a GND conductor 22. FIG. 4 shows the cross-sectional shape of a 2-conductor microstrip line composed of signal conductors 31 and 32, and a GND conductor 33.

Figure 5:
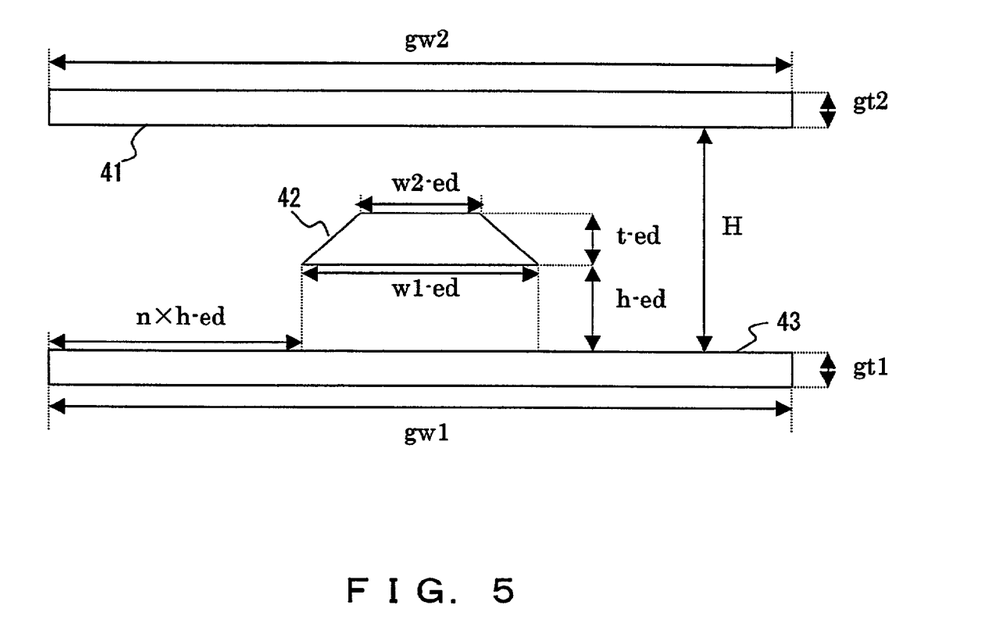
FIG. 5 shows a third conductor model.
Figure 6:
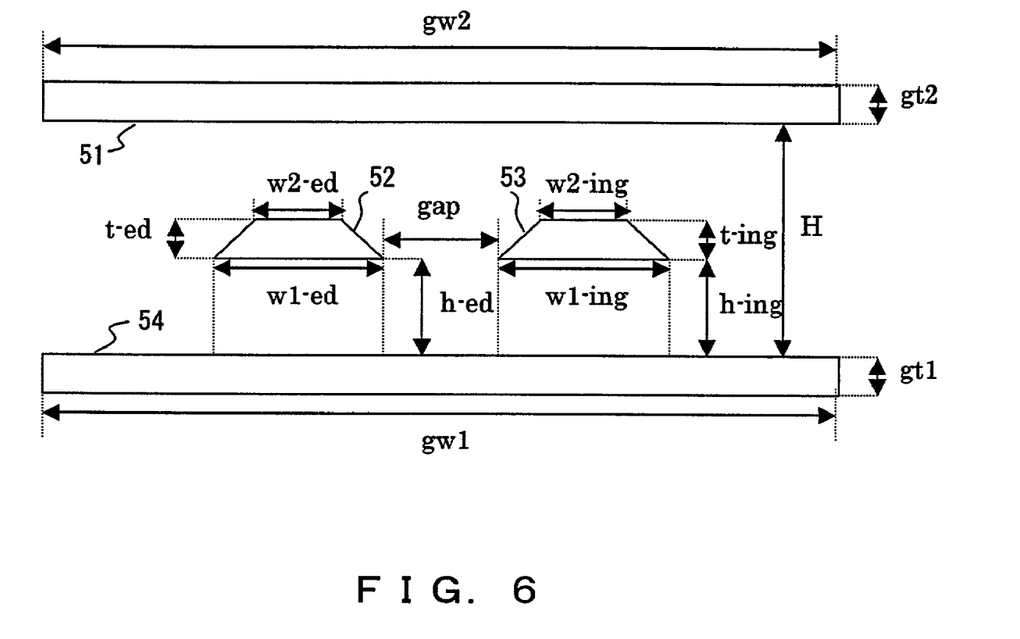
FIG. 6 shows a fourth conductor model.

Furthermore, FIG. 5 shows the cross-sectional shape of a single-conductor strip line composed of a signal conductor 42, and GND conductors 41 and 43. FIG. 6 shows the cross-sectional shape of a 2-conductor strip line composed of signal conductors 52 and 53, and GND conductors 51 and 54. As is known from these figures, an arbitrary quadrilateral including a rectangle or a trapezoid can be handled as a cross-sectional shape of a signal conductor. As parameters of a cross-sectional shape, the followings are input.

(1) a parameter specifying a microstrip or strip line
(2) N: the number of signal conductors (N=1 in the case of a single conductor. N=2 in the case of two conductors)
(3) H: the height of an insulation layer in a strip line
(4) h-ed: the height of the lower base of a first signal conductor with reference to the surface of a first GND conductor
(5) w1-ed: the width of the lower base of the first signal conductor
(6) w2-ed: the width of the upper base of the first signal conductor
(7) t-ed: the thickness of the first signal conductor
(8) gw1: the width of the first GND conductor
(9) gt1: the thickness of the first GND conductor
(10) gw2: the width of a second GND conductor
(11) gt2: the thickness of the second GND conductor
(12) h-ing: the height of the lower base of the second signal conductor with reference to the surface of the first GND conductor
(13) w1-ing: the width of the lower base of the second signal conductor
(14) w2-ing: the width of the upper base of the second signal conductor
(15) t-ing: the thickness of the second signal conductor
(16) gap: the distance between the first and the second signal conductors The width of the GND conductor among these parameters can be also specified by using a GND scaling factor n as shown in FIGS. 3 and 5. In this case, the user inputs the GND scaling factor n instead of gw1, and gw1 is obtained with the following equation.

$$gw1 = h\text{-}ed \times n \times 2 + w1\text{-}ed \qquad (1)$$

Also gw2 can be specified by using a GND scaling factor.

Next, the user selects either a common mode or a differential mode.

If the signs of voltages (the orientations of electric currents) of two signal conductors are the same, the common mode is selected. If they differ, the differential mode is selected. Additionally, as an analysis condition, a signal frequency f and a conductor conductivity σ are input. For example, Hz (hertz) is used as the unit of a frequency, and $5.0 \times 10^7$ (1/Ωm) is used as the conductivity of copper in the case of 20 degrees centigrade.

Furthermore, the user inputs a division condition of a conductor, and the vertical and the horizontal division numbers of a segment. At this time, different division numbers can be specified for the case where the same segments are integrated, or the case where different segments are integrated. By way of example, if the segments are more finely divided in the former case, and if the segments are more coarsely divided in the latter case, the integration calculation can be made more efficient, and a divergence problem of an integration value can be prevented.

Next, the skin resistance coefficient calculating unit 15 calculates a depth δ of a skin with the following equation by assuming the permeability in a vacuum to be μ (step S2).

$$\delta = 1/(\pi f \mu \delta)^{1/2} \qquad (2)$$

Next, it is determined whether each conductor is either a signal conductor or a GND conductor (step S3). If the conductor is a signal conductor, it is divided as follows (step S4).

A preset number of division rates are predetermined, and the cross-section of a conductor is divided by a length of "δ×division rate" both vertically and horizontally. These division rates are set so that an interval is smaller in a portion nearer to the surface of the conductor, and larger in a portion farther from the surface.

For example, if 5 values 0.33, 0.84, 1.90, 4.00, and 7.00 are set as division rates, dividing faces parallel to the surface of the signal conductor are generated in positions the depths of which are δ×0.33, δ×0.84, δ×1.90, δ×4.00, and δ×7.00 from the surface. Accordingly, an interval of dividing faces becomes smaller in a portion nearer to the surface, and becomes larger in a portion farther from the surface.

With such a division method, the vertical and the horizontal lengths of a segment (an interval of dividing faces) vary according to the depth δ of a skin and the value of a division rate, and the number of segments changes according to the number of division rates.

A segment whose vertical-to-horizontal ratio does not satisfy a preset condition among the segments generated with this division is divided more finely. For example, if a condition that the vertical-to-horizontal ratio is within 1:10 or 10:1 is specified, a segment thinner than this vertical-to-horizontal ratio is again divided to satisfy the condition.

Figure 7:
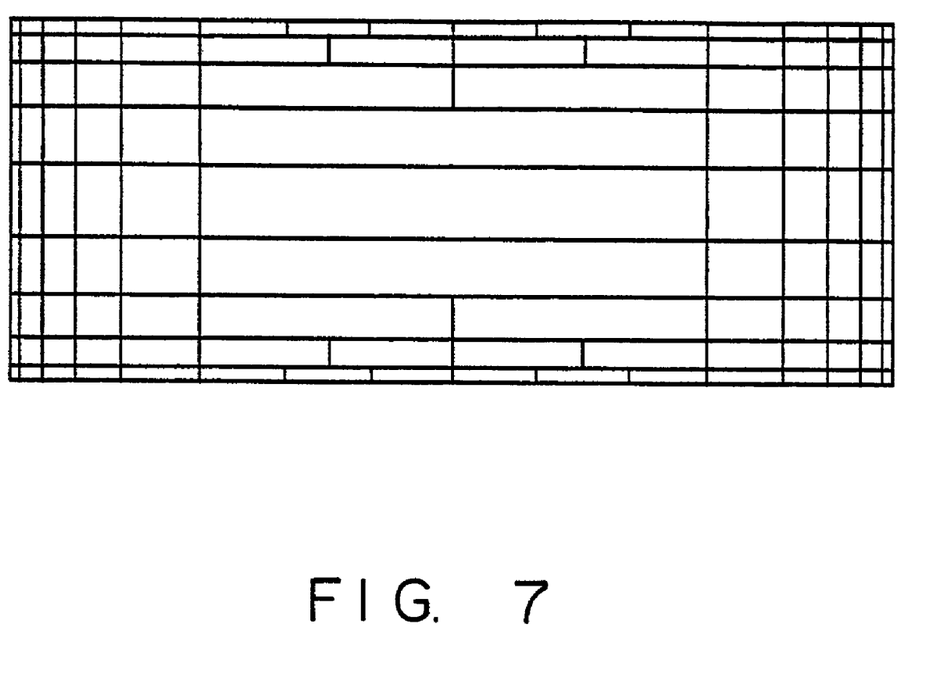
FIG. 7 shows a method dividing a signal conductor.

If a signal conductor having a rectangular cross section is divided with this method, it is divided into a plurality of segments shown in FIG. 7. Since the dividing faces are parallel to the surface of the conductor, also the cross-sectional shape of each of the segments is rectangular. Additionally, a portion nearer to the surface of the conductor is more finely divided, and the size of a segment becomes smaller. On the other hand, a portion farther from the surface of the conductor is more coarsely divided, and the size of a segment becomes larger.

As described above, a conductor is divided in parallel to the surface, and a portion nearer to the surface is more finely divided, so that a portion where an electric current flows is calculated in further detail, and a calculation of a portion where an electric current does not flow can be simplified.

Additionally, for a GND conductor, different division methods are respectively used in vertical and horizontal directions (step S5). For the vertical direction, a division is made from the surface of the side facing the signal conductor by the length of "δ×division rate", similar to the signal conductor. For the horizontal direction, a portion nearer to the signal conductor is more finely divided, and a portion farther from the signal conductor is more coarsely divided. For the GND conductor, there is a tendency that an electric current normally concentrates in a portion facing a signal conductor. Therefore, a calculation of a portion where an electric current does not flow can be simplified by making such divisions.

Figure 8:
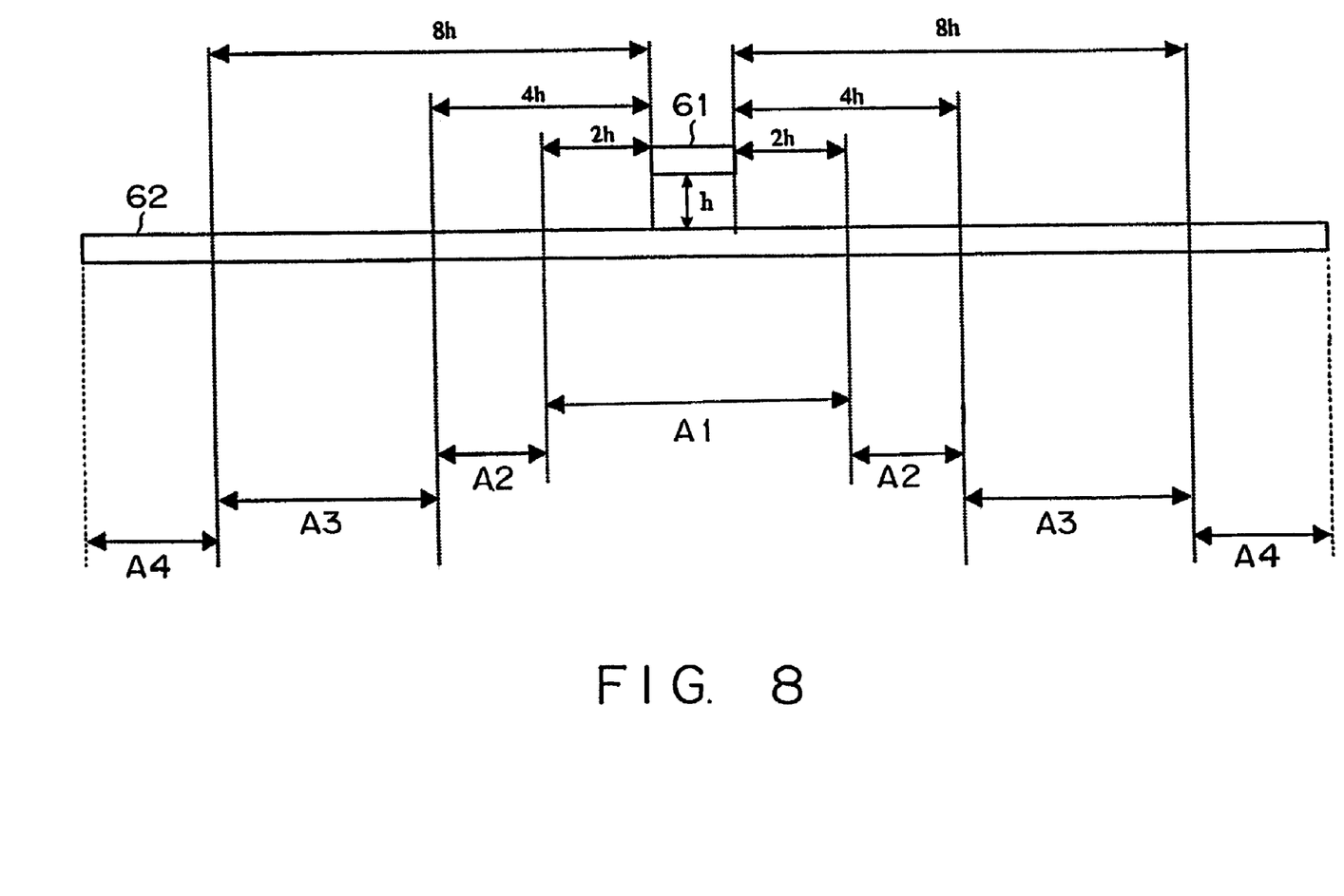
FIG. 8 shows a first method dividing a GND conductor.

Here, a normal is drawn from the end of the signal conductor to the GND conductor, and the length of a segment in the horizontal direction is determined according to the distance from the intersection point of the normal and the surface of the GND conductor. For example, the GND conductor is divided as follows by assuming that the distance (h-ed or h-ing) from the surface of the GND conductor to the signal conductor is h.

the range from the end of the signal conductor to 2 h
=divided by a width of h/4
the range from 2 h to 4 h
divided by a width of h/2
the range from 4 h to 8 h
divided by a width of h
the range of 8 h or farther
divided by a width of 2 h FIG. 8 shows the method dividing a GND conductor of a single conductor model in the horizontal direction. In this case, the distance between a signal conductor 61 and a GND conductor 62 is assumed to be h, and the GND conductor is divided with the above described division method. Accordingly, an area A1 is divided by the width of h/4, areas A2 are divided by the width of h/2, areas A3 are divided by the width of h, and areas A4 are divided by the width of 2 h.

Figure 9:
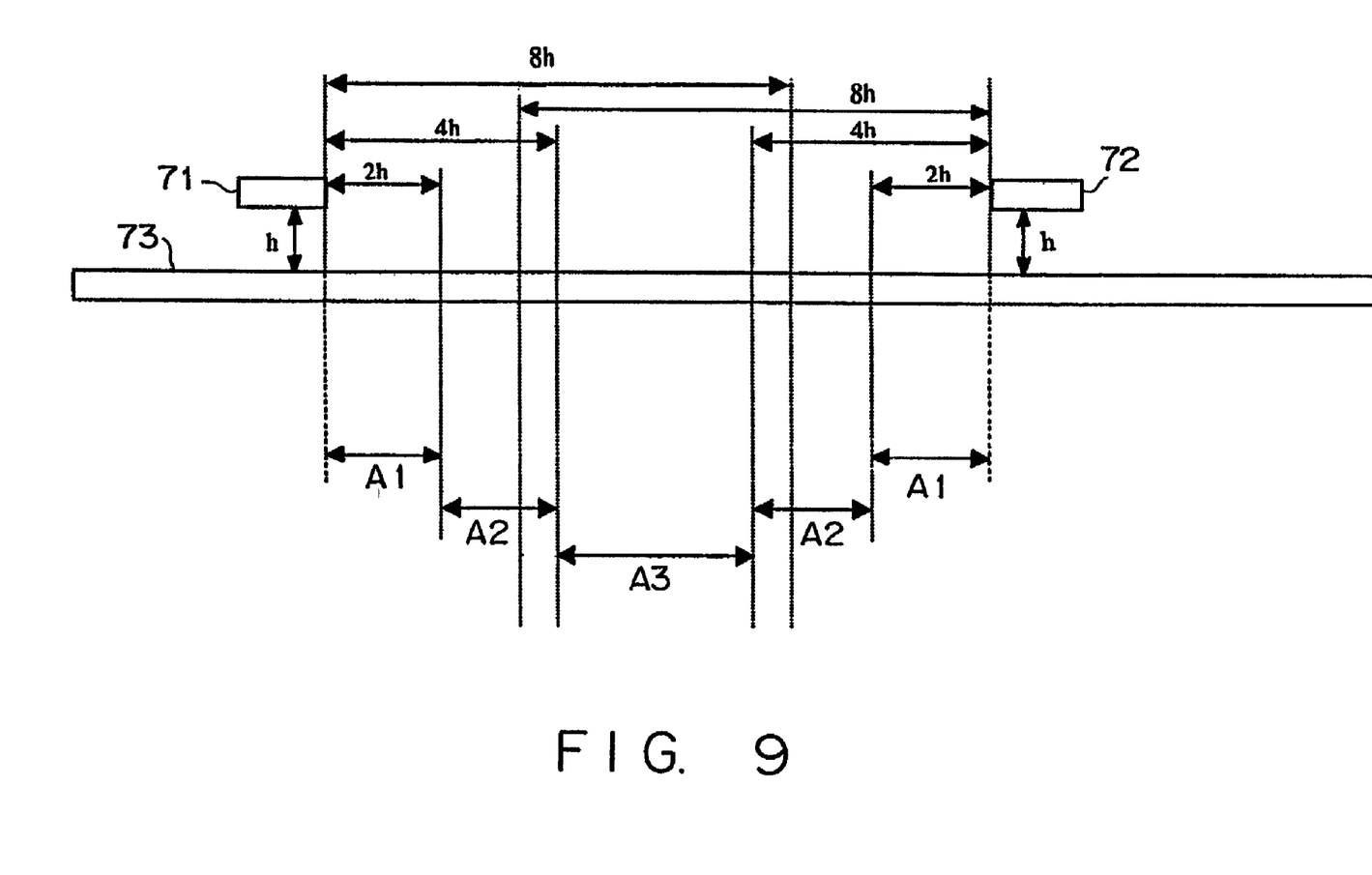
FIG. 9 shows a second method dividing a GND conductor.

FIG. 9 shows the method dividing a GND conductor of a 2-conductor model in the horizontal direction. In this case, the distance between signal conductors 71 and 72 and a GND conductor 73 is assumed to be h, and the GND conductor is divided with the above described division method. Accordingly, areas A1 are divided by the width of h/4, areas A2 are divided by the width of h/2, and an area A3 is divided by the width of h. In FIG. 9, the distances between the signal conductors 71 and 72 and the GND conductor 73 are equal. However, if the distances differ, a shorter distance is used as h.

Also for the vertical-to-horizontal ratio of a segment that is obtained by dividing the GND conductor, for example, the following conditions are set according to the distance h between the signal conductor and the GND conductor.

the range from the end of the signal conductor to h
within 1:10
the range from h to 2 h
within 1:40
the range from 2 h to 4 h
within 1:80

For a segment whose vertical-to-horizontal ratio does not satisfy a set condition, it is more finely divided to satisfy the condition.

Figure 10:
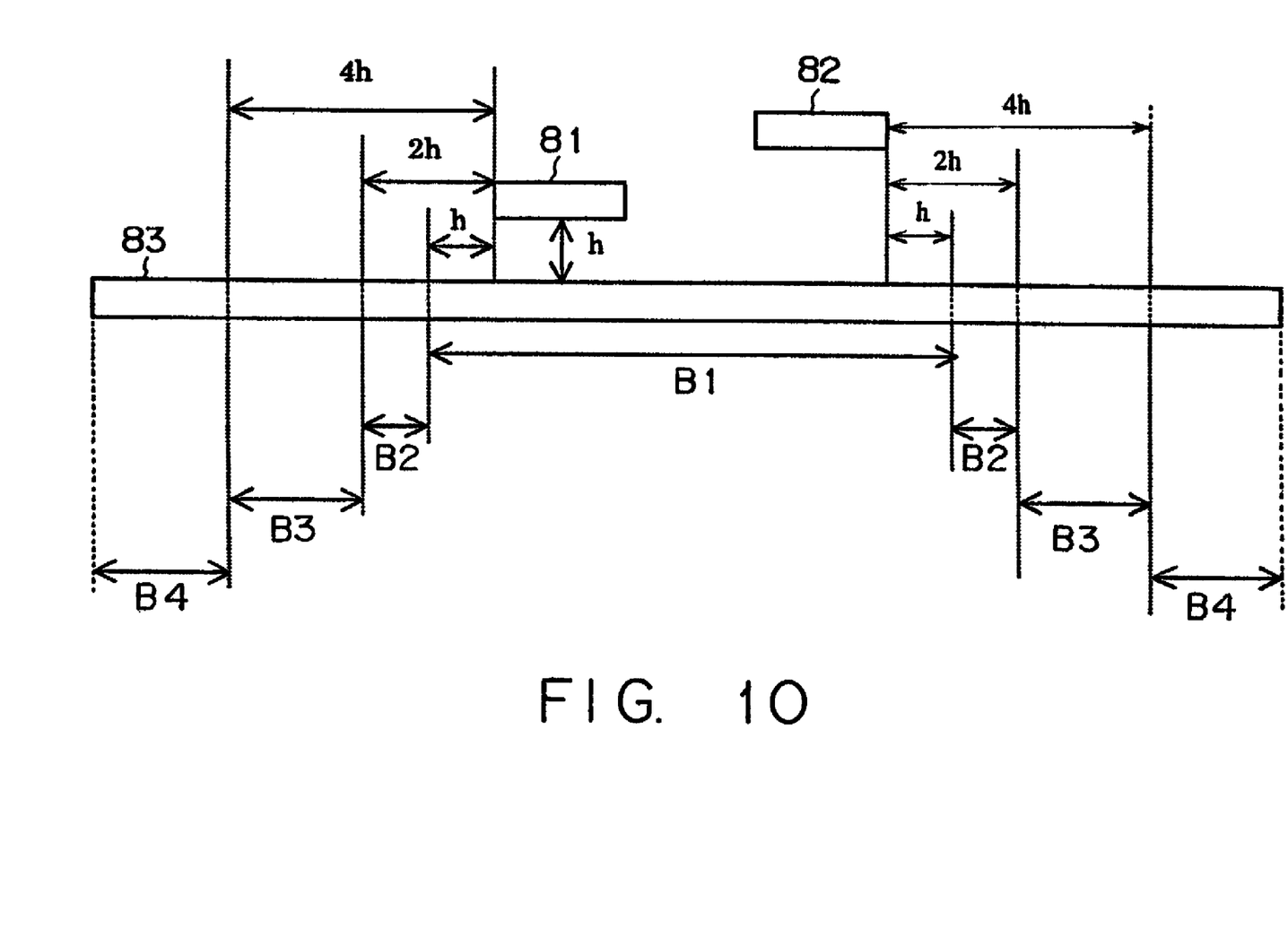
FIG. 10 shows a third method dividing a GND conductor.

FIG. 10 shows the method again dividing a GND conductor of a 2-conductor model in the horizontal direction. In this case, since a signal conductor 81 is nearer to a GND conductor 83 than a signal conductor 82, the above described vertical-to-horizontal ratio is set by assuming the distance between the signal conductor 81 and the GND conductor 83 to be h. Accordingly, an area B1 is again divided so that the vertical-to-horizontal ratio is within 1:10, areas B2 are again divided so that the vertical-to-horizontal ratio is within 1:40, and areas B3 are again divided so that the vertical-to-horizontal ratio is within 1:80. For areas B4, they are not again divided because a condition is not set.

In this way, the signal conductor and the GND conductor are divided into segments. Next, the skin resistance coefficient calculating unit 15 vertically and horizontally divides each of the segments by a specified division number, and calculates the inductance and the resistance with the following equations (step S6).

$$L^{(p)}_{ij,km} = -\frac{\mu}{4\pi A_{ij} A_{km}} \int \int \int \int \ln[(y-y')^2 + (z-z')^2] dy' dz' dy dz \quad (3)$$

$$R_{ij,km} = r_{00} + r_{ij}\delta_{ik}\delta_{jm} \quad (4)$$

$$r_{ij} = 1/\sigma_i A_{ij}, \, \delta_{ii}=1, \, \delta_{ij}=0 (i \neq j) \quad (5)$$

$$L_{ij,km} = L^{(p)}_{ij,km} - L^{(p)}_{ij,00} - L^{(p)}_{00,km} + L^{(p)}_{00,00} \quad (6)$$

where i and k represent conductor numbers (i, k=0, 1, ... N), and j and m represent segment numbers within each of the conductors (j=0, 1, ..., $N_i$, m=0, 1, ..., $N_k$). The 0th conductor corresponds to a GND conductor, whereas 1st to Nth conductors correspond to signal conductors. Additionally, the 0th segment represents a reference segment that exists only in the GND conductor, and $N_i$ represents the number of the last segment in the ith conductor. jth segment in the jth conductor is denoted as (i,j) below.

In the equation (3), the integration of y and z represents the integration for the cross-sectional area of the segment (i,j), and the integration of y' and z' represents the integration for the cross-sectional area of a segment (k,m).

Additionally, $L^{(p)}_{ij,km}$ represents the inductance between the segments (i,j) and (k,m), and $A_{ij}$ represents the cross-sectional area of the segment (i,j). Furthermore, $r_{ij}$ represents the DC (direct current) resistance per unit length of the segment (i,j), and $\sigma_i$ represents the conductivity of an ith conductor. Still further, $R_{ij,km}$ and $L_{ij,km}$ respectively represent the resistance and the inductance of each segment.

Next, impedance $Z_{ij,km}$ is calculated with the following equation by using $J=(-1)^{1/2}$ and an angular frequency $\omega$.

$$Z_{ij,km} = R_{ij,km} + J\omega L_{ij,km} \quad (7)$$

Hereinafter, it is assumed that an impedance matrix having the impedance represented by the equation (7) as an element is denoted as Z, and impedance matrices in the case of f≠0 and f=0 (DC) are respectively denoted as $Z_{(f)}$ and $Z_{(DC)}$.

Next, admittance matrices $Y_{(f)}$ and $Y_{(DC)}$ are calculated with the following equations (step S7).

$$Y_{(f)} = Z_{(f)}^{-1} \quad (8)$$

$$Y_{(DC)} = Z_{(DC)}^{-1} \quad (9)$$

Then, V=1(V) is set, and the electric current value of each segment is calculated with the following equation.

$$I_{(f)} = Y_{(f)} V \quad (10)$$

Next, reduction is performed for admittance matrices $Y_{(f)}$ and $Y_{(DC)}$ with the following expressions (step S8).

$$y_{ik} = \sum_{j=1}^{N_i} \sum_{m=1}^{N_k} Y_{ij,km} \, (i, k = 1, \ldots, N) \quad (11)$$

$$Y_{(f)} \Rightarrow y_{(f)} \quad (12)$$

$$Y_{(DC)} \Rightarrow y_{(DC)} \quad (13)$$

As a result of this reduction, $Y_{ij,km}$ are summed up for all of the segments within each of the conductors, and the elements for the GND conductor are dropped. Accordingly, $y_{(f)}$ and $y_{(DC)}$ become a matrix of 1×1 in the case of a single conductor, or a matrix of 2×2 in the case of two conductors.

Next, the admittance matrices are restored to impedance matrices (step S9).

$$z_{(f)} = y_{(f)}^{-1} \quad (14)$$

$$z_{(DC)} = y_{(DC)}^{-1} \quad (15)$$

Here, assuming that the resistance and the inductance of the signal conductor in the case of f≠0 are respectively denoted as $R_{(f)}$ and $L_{(f)}$, and the resistance and the inductance in the case of f=0 are respectively denoted as $R_{(DC)}$ and $L_{(DC)}$, the following equations are satisfied.

$$z_{(f)} = R_{(f)} + J\omega L_{(f)} \quad (16)$$

$$z_{(DC)} = R_{(DC)} + J\omega L_{(DC)} \quad (17)$$

Then, $R_{(f)}$, $R_{(DC)}$, $L_{(f)}$, and $L_{(DC)}$ are obtained with the equations (16) and (17), and a skin resistance coefficient $R_s$ is calculated with the following equation (step S10).

$$R_s = (R_{(f)} - R_{(DC)})/f^{1/2} \quad (18)$$

After $R_s$ is calculated, the simulation device displays an obtained result of the calculation on the screen of the displaying unit 13, and outputs the result to a log file (step S11). At this time, settings can be made to append the calculation result to the end of an existing log file. Furthermore, as output settings of a calculation result, for example, a necessary item is selected from among the following items.
(1) segment information
(2) resistance and inductance of each segment
(3) impedance matrix
(4) admittance matrix
(5) electric current value of each segment
(6) skin resistance coefficient Furthermore, if skin resistance coefficients are obtained for a plurality of frequencies, for example, 1 GHz and 2 GHz, these frequencies are preset in an input file, so that a calculation can be successively made.

Figure 11:
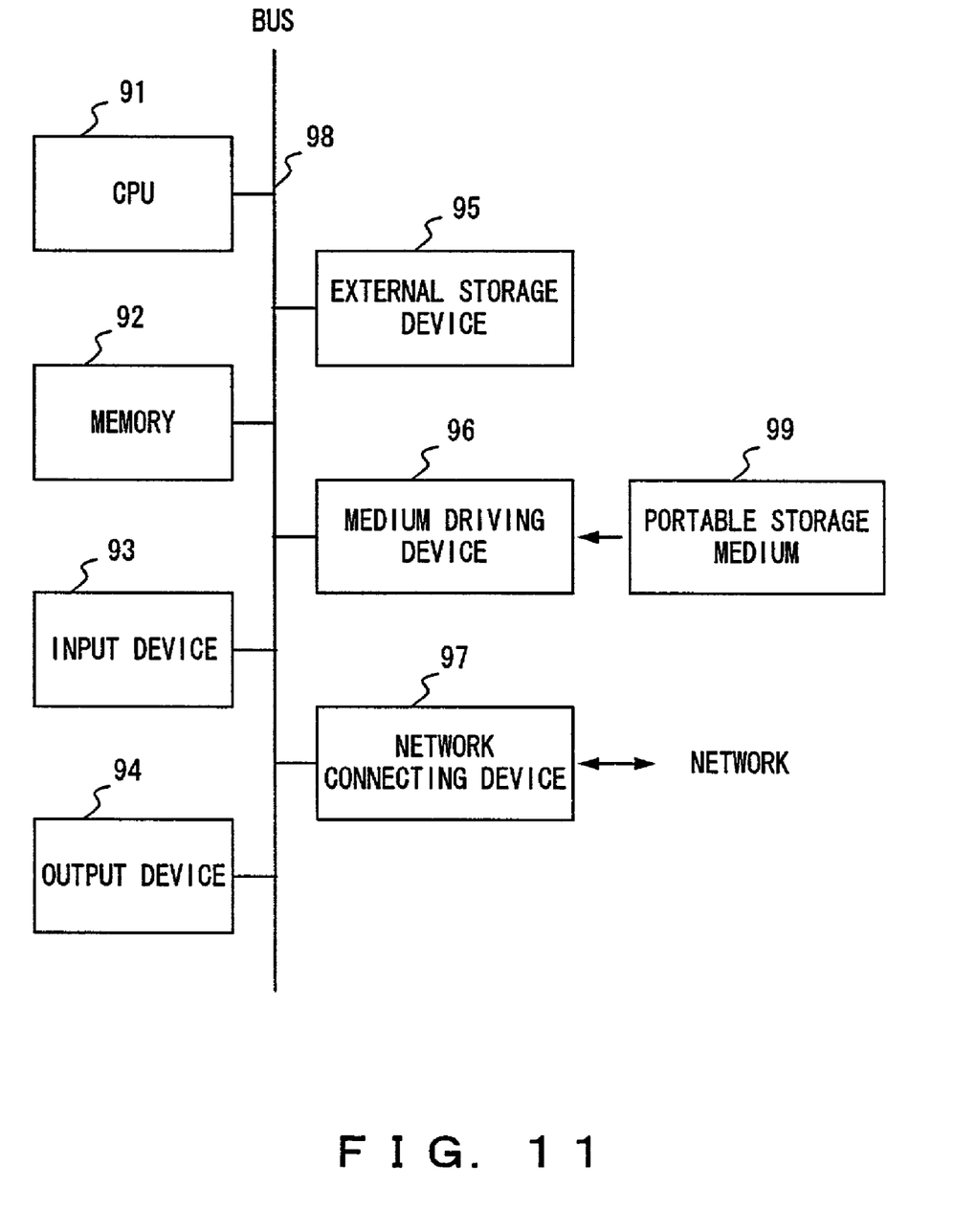
FIG. 11 shows the configuration of an information processing device.

The simulation device shown in FIG. 1 is configured, for example, by an information processing device (computer) shown in FIG. 11. The information processing device shown in FIG. 11 comprises a CPU (Central Processing Unit) 91, memory 92, an input device 93, an output device 94, an external storage device 95, a medium driving device 96, and a network connecting device 97, which are interconnected by a bus 98.

The memory 92 includes, for example, ROM (Read-Only Memory), RAM (Random Access memory), etc., and stores a program and data, which are used for processes. The CPU 91 performs necessary processes by executing the program with the memory 92. The storing unit 12 shown in FIG. 1 corresponds to the memory 92, and the controlling unit 14, the skin resistance coefficient calculating unit 15, and the analyzing unit 16, which are shown in FIG. 1, correspond to the program stored in the memory 92.

The input device 93 is, for example, a keyboard, a pointing device, a touch panel, etc., and is used to input an instruction or information from a user. The output device 94 is, for example, a display, a printer, a speaker, etc., and is used to output an inquiry to a user or a process result. The inputting unit 11 and the displaying unit 13, which are shown in FIG. 1, respectively correspond to the input device 93 and the output device 94.

The external storage device 95 is, for example, a magnetic disk device, an optical disk device, a magneto-optical disk device, a tape device, etc. The information processing device stores the above described program and data in the external storage device 95, and uses the program and data by loading them into the memory 92 on demand.

The medium driving device 96 drives a portable storage medium 99, and accesses its stored contents. As the portable storage medium 99, an arbitrary computer-readable storage medium such as a memory card, a floppy disk (registered trademark), a CD-ROM (Compact Disc-Read-Only Memory), an optical disc, a magneto-optical disc, etc. is used. A user stores the above described program and data onto this portable storage medium 99, and uses the program and data by loading them into the memory 92 on demand.

The network connecting device 97 is connected to an arbitrary communications network such as a LAN (Local Area Network), the Internet, etc., and performs data conversion which accompanies a communication. The information processing device receives the above described program and data from a different device via the network connecting device 97, and uses the program and data by loading them into the memory 92 on demand.

Figure 12:
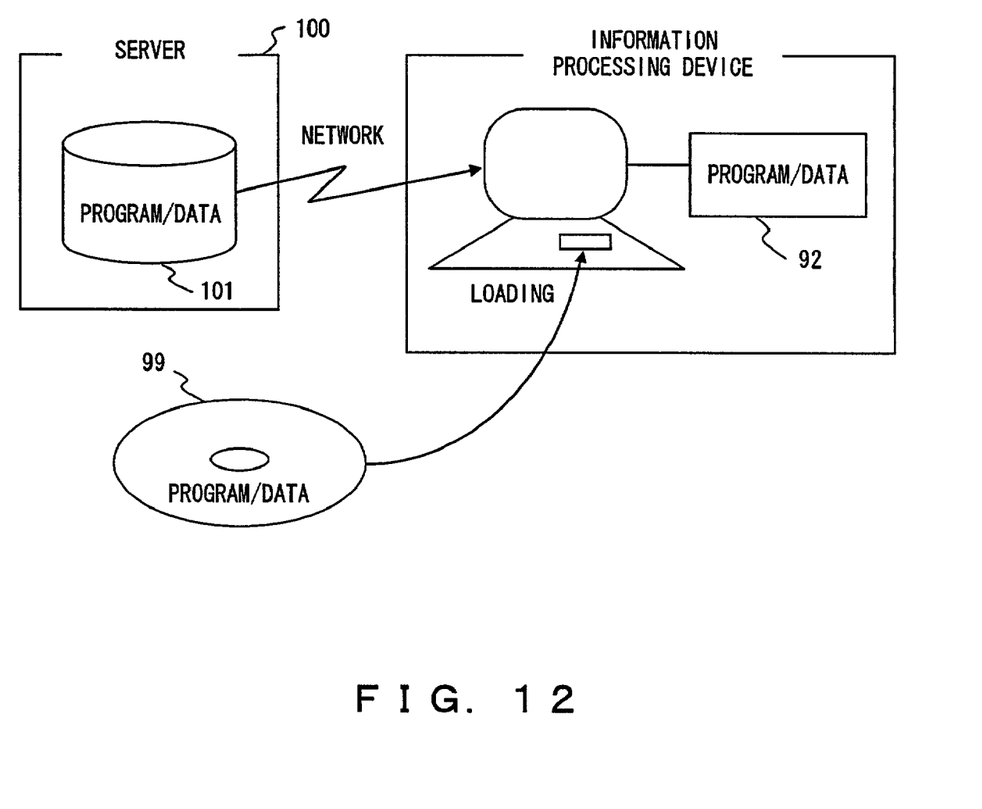
FIG. 12 shows storage media.

FIG. 12 shows computer-readable storage media that can provide a program and data to the information processing device shown in FIG. 11. The program and data stored onto the portable storage medium 99 or in a database 101 of a server 100 are loaded into the memory 92. At this time, the server 100 generates a propagation signal propagating the program and data, and transmits the propagation signal to the information processing device via an arbitrary transmission medium on a network. Then, the CPU 91 executes the program with the data, and performs necessary processes.

According to the present invention, in a simulation considering a skin effect, a calculation of a portion where an electric current does not flow can be simplified while maintaining the calculation accuracy of a portion where an electric current flows within a conductor. Accordingly, the resistance and the skin resistance coefficient of the conductor can be quickly obtained with high accuracy.

What is claimed is:

1. A computer-readable storage medium on which is recorded a program for causing a computer, which obtains resistance of a conductor in consideration of a skin effect according to a frequency of a given signal, to execute a process, the process comprising:

generating a model where a conductor is divided by a plurality of faces parallel to a surface of the conductor, which are set so that intervals of the faces are smaller as the faces are nearer to the surface, and larger as the faces are farther from the surface;

calculating resistance of the conductor, which corresponds to the frequency, by using a generated model; and outputting a calculation result.

2. The computer-readable storage medium according to claim 1, wherein the computer generates a model where the intervals of the plurality of faces vary according to a depth of a skin.

3. The computer-readable storage medium according to claim 1, the process further comprising calculating a skin resistance coefficient of the conductor by using the generated model, and outputting an obtained skin resistance coefficient.

4. A computer-readable storage medium on which is recorded a program for causing a computer, which obtains resistance of a conductor in consideration of a skin effect according to a frequency of a given signal, to execute a process, the process comprising:

calculating a depth of a skin by using the frequency;

generating a model where a depth from a surface of a conductor is represented by a product of the depth of the skin and a division rate, a signal conductor is vertically and horizontally divided by a plurality of faces parallel to a surface of the signal conductor, which are set with a plurality of division rates so that intervals of the faces are smaller as the faces are nearer to the surface of the conductor and larger as the faces are farther from the surface, a ground conductor is vertically divided by a plurality of faces parallel to a surface of the ground conductor, which are set by using the plurality of division rates, and the ground conductor is horizontally divided by a plurality of faces which are set based on a distance between the signal conductor and the ground conductor;

calculating resistance of the signal conductor, which corresponds to the frequency, by using a generated model; and outputting a calculation result.

5. A propagation signal propagating a program to a computer which obtains resistance of a conductor in consideration of a skin effect according to a frequency of a given signal, the program causing the computer to perform:

generating a model where a conductor is divided by a plurality of faces parallel to a surface of the conductor, which are set so that intervals of the faces are smaller as the faces are nearer to the surface, and larger as the faces are farther from the surface;

calculating resistance of the conductor, which corresponds to the frequency, by using a generated model; and outputting a calculation result.

6. A propagation signal propagating a program to a computer which obtains resistance of a conductor in consideration of a skin effect according to a frequency of a given signal, the program causing the computer to perform:

calculating a depth of a skin by using the frequency;

generating a model where a depth from a surface of a conductor is represented by a product of the depth of the skin and a division rate, a signal conductor is vertically and horizontally divided by a plurality of faces parallel to a surface of the signal conductor, which are set with a plurality of division rates so that intervals of the faces are smaller as the faces are nearer to the surface of the conductor and larger as the faces are farther from the surface, a ground conductor is vertically divided by a plurality of faces parallel to a surface of the ground conductor, which are set by using the plurality of division rates, and the ground conductor is horizontally divided by a plurality of faces which are set based on a distance between the signal conductor and the ground conductor;

calculating resistance of the signal conductor, which corresponds to the frequency, by using a generated model; and outputting a calculation result.

7. A calculation method obtaining resistance of a conductor in consideration of a skin effect according to a frequency of a given signal, comprising:

setting a plurality of faces parallel to a surface of a conductor so that intervals of the faces are smaller as the faces are nearer to the surface, and larger as the faces are farther from the surface;

generating a model where the conductor is divided by the plurality of faces; and calculating resistance of the conductor, which corresponds to the frequency, by using a generated model.

8. A processing device obtaining resistance of a conductor in consideration of a skin effect according to a frequency of a given signal, comprising:

a generating device generating a model where a conductor is divided by a plurality of faces parallel to a surface of a conductor, which are set so that intervals of the faces are smaller as the faces are nearer to the surface, and larger as the faces are farther from the surface;

a calculating device calculating resistance of the conductor, which corresponds to the frequency, by using a generated model; and an outputting device outputting a calculation result.

* * * * *